(12) United States Patent
Gao et al.

(10) Patent No.: US 10,418,489 B2
(45) Date of Patent: Sep. 17, 2019

(54) THIN FILM TRANSISTOR AND METHOD OF MANUFACTURING THE SAME, AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Shan Gao, Beijing (CN); Tingliang Liu, Beijing (CN); Yang Wang, Beijing (CN); Wei Guo, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 15/660,342

(22) Filed: Jul. 26, 2017

(65) Prior Publication Data

US 2018/0061991 A1    Mar. 1, 2018

(30) Foreign Application Priority Data

Aug. 25, 2016  (CN) .......................... 2016 1 0729830

(51) Int. Cl.
*H01L 23/34* (2006.01)
*H01L 27/12* (2006.01)
*H01L 29/66* (2006.01)
*H01L 29/786* (2006.01)
*C09K 5/16* (2006.01)
*G02F 1/1343* (2006.01)
*G02F 1/1368* (2006.01)

(52) U.S. Cl.
CPC .......... *H01L 29/78606* (2013.01); *C09K 5/16* (2013.01); *G02F 1/1368* (2013.01); *G02F 1/13439* (2013.01); *G02F 1/134309* (2013.01); *H01L 23/345* (2013.01); *H01L 27/1214* (2013.01); *H01L 29/66742* (2013.01); *H01L 29/78696* (2013.01)

(58) Field of Classification Search
CPC ..................................................... H01L 23/345
See application file for complete search history.

(56) References Cited

U.S. PATENT DOCUMENTS

| 2005/0079294 | A1  | 4/2005  | Lin et al. |
| 2007/0284580 | A1  | 12/2007 | Lim et al. |
| 2009/0159880 | A1* | 6/2009  | Honda ................ H01L 29/7869 257/43 |

FOREIGN PATENT DOCUMENTS

| CN | 101086968 A   | 12/2007 |
| JP | 2004-146575 A | 5/2004  |

OTHER PUBLICATIONS

First Office Action, including Search Report, for Chinese Patent Application No. 201610729830.7, dated Jul. 4, 2018, 15 pages.

* cited by examiner

*Primary Examiner* — William A Harriston
(74) *Attorney, Agent, or Firm* — Westman, Champlin & Koehler, P.A.

(57) ABSTRACT

Embodiments of the present disclosure provide a thin film transistor and a method of manufacturing the same, and a display device. In an embodiment, the thin film transistor includes a gate, a gate insulation layer, an active layer, a source electrode and a drain electrode, and further includes a heat source disposed above or below the active layer and configured to heat a channel region of the active layer.

18 Claims, 4 Drawing Sheets

THIN FILM TRANSISTOR AND METHOD OF MANUFACTURING THE SAME, AND DISPLAY DEVICE

CROSS-REFERENCE TO RELATED APPLICATION

This application claims the benefit of the Chinese Patent Application No. 201610729830.7 filed on Aug. 25, 2016 in the State Intellectual Property Office of China, the whole disclosure of which is incorporated herein by reference.

BACKGROUND

Technical Field

Embodiments of the present disclosure generally relate to the field of display technologies, and particularly, to a thin film transistor and a method of manufacturing the same, and a display device.

Description of the Related Art

Thin film transistor (TFT) is one of field-effect transistors, is widely applied in the display field and is very important to working characteristics of a display device.

Conventional thin film transistors may be classified into a bottom gate type thin film transistor (as shown in FIG. 1) and a top gate type thin film transistor (as shown in FIG. 2), which generally comprises: a substrate 0, a gate 1, a gate insulation layer 2, an active layer 3, a source electrode 4 and a drain electrode 5. A channel region of TFT (that is, a carrier transportation region formed in the active layer when a voltage is applied onto the gate of the TFT) has a carrier mobility which will be greatly affected by temperature; the carrier mobility in the channel region of the TFT will be significantly reduced especially during low temperature display, thereby resulting in reduced transmissivity and contrast of the display device and even difficulty in low-temperature startup.

SUMMARY

The present disclosure is made in order to overcome or eliminate at least one of problems and detects in prior arts.

Embodiments of the present disclosure provide a thin film transistor and a method of manufacturing the same, and a display device, for improving a carrier mobility in a channel region of the thin film transistor.

In an aspect, an embodiment of the present disclosure provides a thin film transistor, comprising a gate, a gate insulation layer, an active layer, a source electrode and a drain electrode, wherein the thin film transistor further comprises a heat source disposed above or below the active layer and configured to heat a channel region of the active layer.

In an embodiment, the heat source comprises a heating layer and an electrode for providing a heating trigger signal to the heating layer, the electrode is configured to be electrically connected with a signal line so as to generate the heating trigger signal based on a signal from the signal line, and the heating layer is configured to, when triggered by the heating trigger signal, release heat for heating the channel region.

In an embodiment, the heating layer includes a polymer layer, the electrode includes a pulse electrode for providing a thermal pulse trigger signal to the polymer layer, the pulse electrode is configured to be electrically connected with a pulse signal line for transmitting a pulse signal to the pulse electrode, and the polymer layer is configured to release heat when triggered by the thermal pulse trigger signal.

In an embodiment, the material of the polymer layer includes a material capable of absorbing and storing light energy and configured to, when triggered by a thermal pulse, produce a chemical reaction and release heat.

In an embodiment, an area of an orthographic projection of the heat source on a plane where a substrate, on which the gate, the gate insulation layer, the active layer, the source electrode and the drain electrode are formed, is located is equal to or larger than an area of an orthographic projection of the channel region of the active layer on the plane.

In some embodiments, the heat source is located on a side of the gate facing away from the active layer.

In some embodiments, the thin film transistor is a bottom gate type thin film transistor and the heat source is located below the gate; or the thin film transistor is a top gate type thin film transistor and the heat source is located above the gate.

In some embodiments, the heat source is located on a side of the active layer facing away from the gate, and the thin film transistor further comprises an insulation layer between the heat source and the active layer.

In an embodiment, the polymer layer is closer to the active layer than the pulse electrode.

In an embodiment, the pulse electrode is disposed in the same layer as the pulse signal line.

In an embodiment, a line width of the electrode is smaller than a line width of the signal line.

In an embodiment, a line width of the pulse electrode is smaller than a line width of the pulse signal line.

In an embodiment, the electrode has an annular shape or curved shape.

An embodiment of the present disclosure further provides a display device, comprising the thin film transistor provided in any of embodiments of the present disclosure.

An embodiment of the present disclosure further provides a method of manufacturing a thin film transistor, the method comprises forming a gate, a gate insulation layer, an active layer, a source electrode and a drain electrode on a substrate, and the method further comprises: forming a heat source above or below the active layer, the heat source being configured to heat a channel region of the active layer.

In an embodiment, the forming the heat source comprises: forming a polymer layer and a pulse electrode for providing a thermal pulse trigger signal to the polymer layer, the pulse electrode being configured to be electrically connected with a pulse signal line for transmitting a pulse signal to the pulse electrode, the polymer layer being configured to, when triggered by the thermal pulse trigger signal, release heat.

In an embodiment, the method comprises forming the polymer layer and the pulse electrode by using a same mask.

In an embodiment, the forming the polymer layer and the pulse electrode by using the same mask comprises:
forming a layer of polymer film and a layer of metal film respectively; and
patterning the layer of polymer film and the layer of metal film by using the same mask so as to form the polymer layer and the pulse electrode.

In an embodiment, the forming the polymer layer and the pulse electrode by using the same mask comprises:
forming a layer of polymer film;
patterning the layer of polymer film by using a mask so as to form the polymer layer;
forming a layer of metal film; and patterning the layer of metal film by using the same mask so as to form the pulse electrode.

DETAILED DESCRIPTION OF EMBODIMENTS

Figure 1:
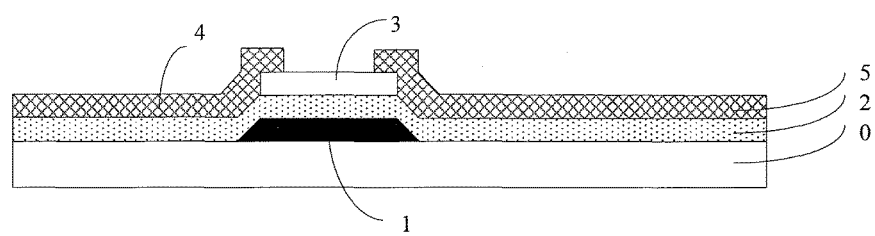
FIG. 1 is a structural schematic diagram showing a conventional bottom gate type thin film transistor.
Figure 2:
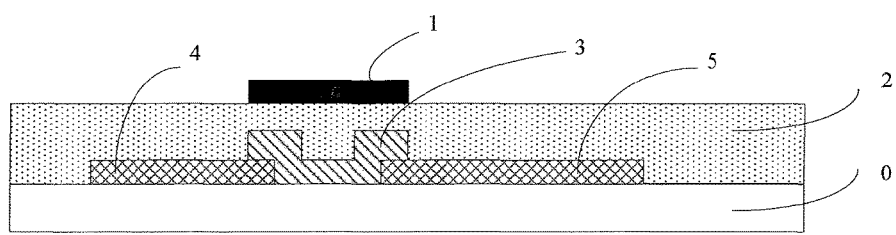
FIG. 2 is a structural schematic diagram showing a conventional top gate type thin film transistor.

Embodiments of the present disclosure provide a thin film transistor and a method of manufacturing the same, and a display device, for improving a carrier mobility in a channel region of the thin film transistor.

Technical solutions of embodiments of the present disclosure will be further described clearly with reference to the accompanying drawings. Apparently, the described embodiments are just some, rather than all, of the embodiments of the present disclosure. All other embodiments obtained by those skilled in the art based on the embodiments described in the present disclosure without making creative work fall within the scope of the present disclosure.

It is noted that thicknesses and shapes of various layers shown in the drawings of the present disclosure do not reflect real scales, rather, are only intended to schematically illustrate contents of the present disclosure.

It is also noted that the technical solutions provided in embodiments of the present disclosure are applicable to a bottom gate type thin film transistor and a top gate type thin film transistor, structures of which will be described respectively hereinafter.

Figure 3:
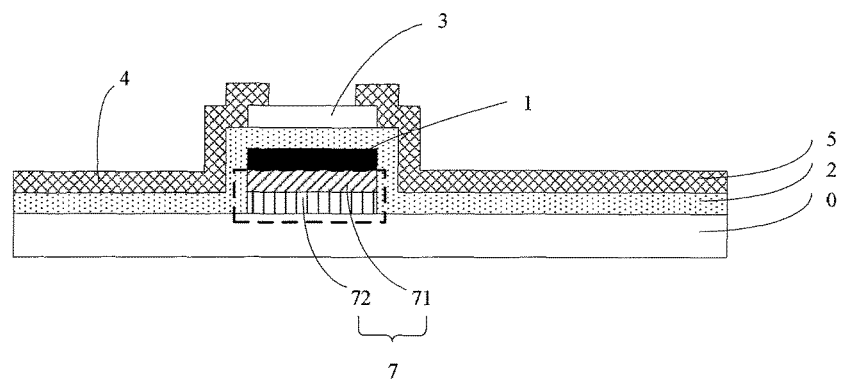
FIG. 3 is a structural schematic diagram showing a thin film transistor according to an embodiment of the present disclosure.

An embodiment of the present disclosure provides a thin film transistor. Referring to FIG. 3, the thin film transistor is a bottom gate type thin film transistor, and comprises a substrate 0, a gate 1, a gate insulation layer 2, an active layer 3, a source electrode 4 and a drain electrode 5. The thin film transistor further comprises a heat source 7 (as indicated by dashed frame shown in FIG. 3) disposed below the active layer 3 and configured to heat a channel region of the active layer. Exemplarily, the heat source 7 may, when triggered by a trigger signal (generally, the trigger signal is sent to the heat source 7 before the TFT is turned on or when the TFT is just turned on), release heat to heat the channel region in the active layer of the thin film transistor.

The heat source 7 may, when triggered by a trigger signal, release heat to heat the channel region in the active layer of the thin film transistor, thus the carrier mobility in the channel region of the thin film transistor may be improved.

Figure 7:
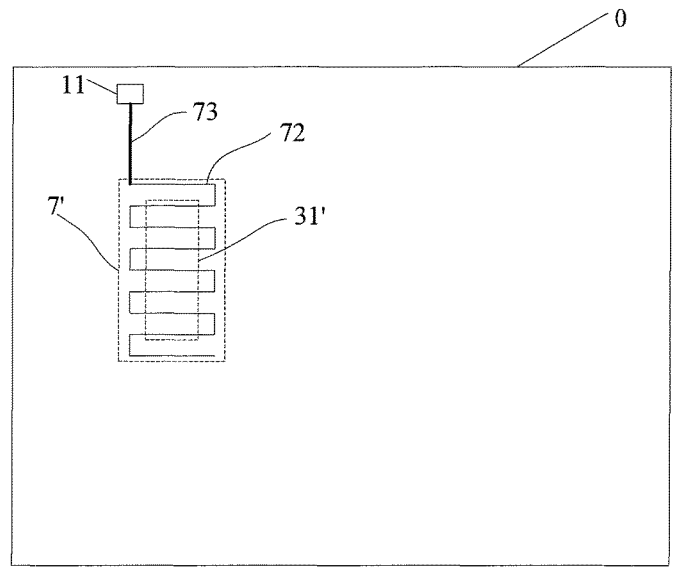
FIG. 7 is a plan view showing an exemplary arrangement of a heat source and a pulse electrode thereof of a thin film transistor according to an embodiment of the present disclosure.

In an embodiment, in order to heat the channel region as much as possible so as to improve the carrier mobility in the channel region of the thin film transistor as much as possible, an area of an orthographic projection 7' of the heat source 7 on a plane where the substrate 0 is located is equal to or larger than an area of an orthographic projection 31' of the channel region of the active layer on the plane, as shown in FIG. 7. For example, the orthographic projection of the channel region of the active layer on the plane is located within or overlaps with the orthographic projection of the heat source on the plane.

Exemplarily, the heat source comprises a heating layer and an electrode for providing a heating trigger signal to the heating layer, the electrode is configured for being electrically connected with a signal line so as to generate the heating trigger signal based on a signal from the signal line, and the heating layer is configured to, when triggered by the heating trigger signal, release heat for heating the channel region. In an embodiment, as shown in FIG. 3, the heat source 7 comprises: a polymer layer 71 and a pulse electrode 72 for providing a thermal pulse trigger signal to the polymer layer 71; exemplarily, the pulse electrode 72 may be electrically connected with a pulse signal line 73 (see FIG. 7) for transmitting a pulse signal to the pulse electrode 72 and form a thermal pulse trigger signal based on a received pulse signal. As shown, the pulse signal line 73 transmits a pulse signal from a controller (for example, IC chip) 11 to the pulse electrode 72.

Figure 4:
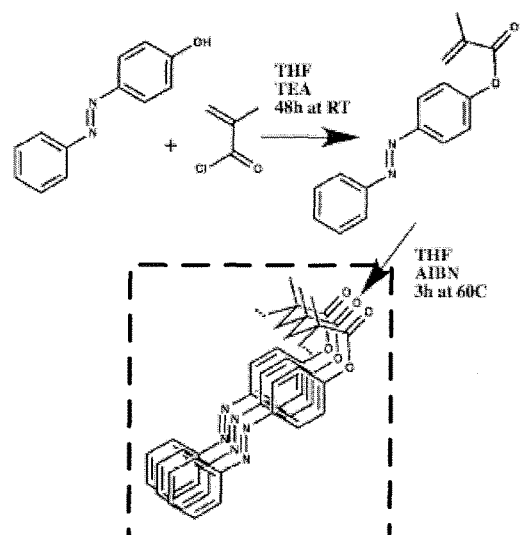
FIG. 4 is a schematic diagram showing synthesis of a material for a polymer layer of a thin film transistor according to an embodiment of the present disclosure.

In an embodiment, as shown in FIG. 4, the material of the polymer layer 71 (as indicated by dashed frame shown in FIG. 4) is capable of absorbing and storing light energy and when triggered by a thermal pulse, produces a chemical reaction and release heat within a duration which is associated with the stored light energy. In an example, the material may be synthesized through following process steps: 4-hydroxy Azobenzene is selected as a raw material, and 2-methacrylic chloride and tetrahydrofuran are added in the raw material, then they react with one another for 48 hours at room temperature and for 3 hours at a temperature environment of 60°, thereby producing a material for the polymer layer 71.

In an embodiment, in order to heat the channel region better and thereby improve the carrier mobility in the channel region of the thin film transistor better, the polymer layer 71 is closer to the active layer or the channel region than the pulse electrode 72.

The pulse electrode 72 and the pulse signal line may be made of same metal material or made of different metal materials, which will not be limited in embodiments of the present disclosure. In an embodiment, in order to simplify process and reduce cost, the pulse electrode 72 is disposed in the same layer as the pulse signal line.

In an embodiment, a line width of the pulse electrode 72 may set as small as possible, while a line width of the pulse signal line may set as large as possible.

The line width of the pulse electrode 72 may set as small as possible and the line width of the pulse signal line may set as large as possible, thus a resistance per unit length of the pulse electrode 72 may be larger than a resistance per unit length of the pulse signal line as much as possible, thereby the pulse electrode 72 can generate more heat per unit length, and the generated heat may be used as a thermal pulse trigger signal for the polymer layer 71.

It is noted that in general, for a display device, its pulse signal line has a fixed length, thus in order to increase the resistance of the pulse electrode as much as possible, for example, the pulse electrode may be formed in an annular shape or curved shape (for example, see FIG. 7), so the length of the pulse electrode is increased, thereby increasing the resistance of the pulse electrode.

In an embodiment, in order to not adversely affect a switching function of the thin film transistor, the heat source 7 is generally not arranged between the active layer 3 and the gate 1, and the heat source 7 is generally not in direct contact with the active layer 3. In an embodiment, as shown in FIG. 3, the heat source 7 is located below the gate 1, on a side of the gate 1 facing away from the active layer. As such, the switching function of the thin film transistor will not be adversely affected, and the process may be simplified.

It is noted that in other embodiments, the heat source 7 may be arranged above the active layer facing 3, and in this case, an insulation layer may be provided between the active layer 3 and the heat source 7, thereby the switching function of the thin film transistor will not be adversely affected.

Figure 5:
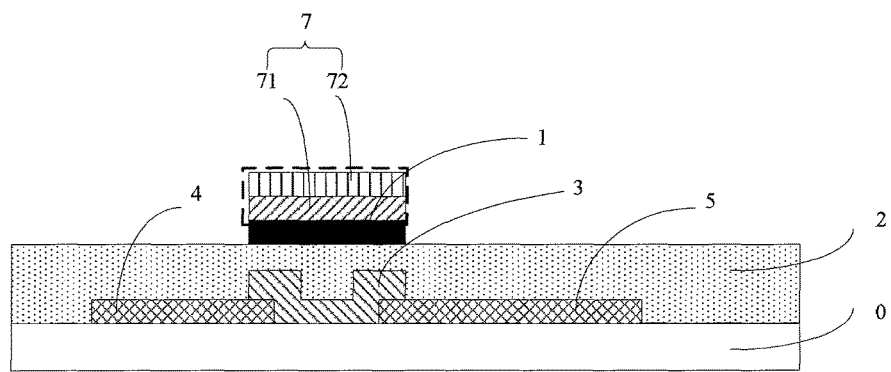
FIG. 5 is a structural schematic diagram showing a thin film transistor according to another embodiment of the present disclosure.

FIG. 5 is a structural schematic diagram showing a thin film transistor according to another embodiment of the present disclosure, the thin film transistor being a top gate type thin film transistor, which is similar to the bottom gate type thin film transistor provided in embodiments of the present disclosure, so the same parts will not repeatedly described, and only the different parts therebetween will be described in the following.

Referring to FIG. 5, the thin film transistor comprises a substrate 0, a gate 1, a gate insulation layer 2, an active layer 3, a source electrode 4 and a drain electrode 5, and further comprises a heat source 7 (as indicated by dashed frame shown in FIG. 5) disposed above the active layer 3 and configured to heat a channel region of the active layer.

In order to not adversely affect a switching function of the thin film transistor, the heat source 7 is generally not arranged between the active layer 3 and the gate 1, and the heat source 7 is generally not in direct contact with the active layer 3. In an embodiment, as shown in FIG. 5, the heat source 7 is located above the gate 1, on a side of the gate facing away from the active layer.

Of course, in other embodiments, the heat source 7 may be arranged below the active layer facing 3, and in this case, an insulation layer may be provided between the active layer 3 and the heat source 7, thereby the switching function of the thin film transistor will not be adversely affected.

Based on the same inventive concept, an embodiment of the present disclosure further provides a method of manufacturing a thin film transistor, the method comprises forming a gate, a gate insulation layer, an active layer, a source electrode and a drain electrode on a substrate, and the method further comprises: forming a heat source above or below the active layer, the heat source being configured to heat a channel region of the active layer.

In an embodiment, the step of forming a heat source comprises: forming a polymer layer and a pulse electrode for providing a thermal pulse trigger signal to the polymer layer; the pulse electrode may be electrically connected with a pulse signal line for transmitting a pulse signal to the pulse electrode.

It is noted that the pulse electrode and the pulse signal line may be manufactured by the same processes for manufacturing the gate and a gate line.

In an embodiment, in order to simplify processes and reduce costs, the polymer layer and the pulse electrode may be formed by using a same mask.

In an example, forming the polymer layer and the pulse electrode by using a same mask may comprise:

forming a layer of polymer film and a layer of metal film respectively; and patterning the layer of polymer film and the layer of metal film by using the same mask so as to form the polymer layer and the pulse electrode.

In an example, forming the polymer layer and the pulse electrode by using a same mask may comprise:

forming a layer of polymer film;

patterning the layer of polymer film by using a mask so as to form the polymer layer;

forming a layer of metal film; and patterning the layer of metal film by using the same mask so as to form the pulse electrode.

It is noted that the steps of forming the polymer layer and of forming the pulse electrode as described above may be set according to actual situations. For example, a layer of metal film may be firstly deposited, then a layer of polymer film is deposited, and the layer of polymer film and the layer of metal film are etched respectively by using a same mask, so as to form the polymer layer and the pulse electrode.

Of course, the polymer layer may be formed by using a different mask from those for forming the pulse electrode and the pulse signal line, that is, different masks are used to form the polymer layer and the pulse electrode respectively, which will not be limited in embodiments of the present disclosure.

In the following, a process flow of a method for manufacturing a thin film transistor according to an embodiment of the present disclosure will be described in detail with reference to FIGS. 6(a) to 6(c), by taking a thin film transistor which is a bottom gate type thin film transistor and a heat source (including a polymer layer and a pulse electrode) located below a gate as an example. Exemplarily, this method mainly includes the following steps.

Figure 6A:
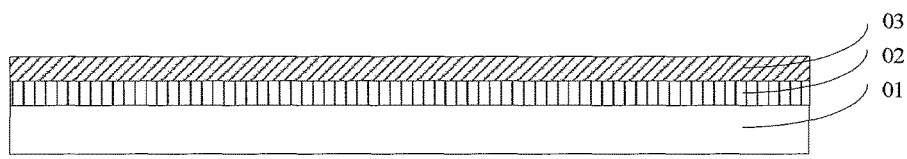
FIGS. 6(a)~6(c) are schematic diagrams showing a process flow of manufacturing a thin film transistor according to an embodiment of the present disclosure.

In step 1, referring to FIG. 6(a), a layer of metal film 02 is deposited on a substrate 01, then a layer of polymer film 03 is deposited;

In some embodiments, the material of layer of polymer film 03 is capable of absorbing and storing light energy, and the material, when triggered by a thermal pulse, produces a chemical reaction and releases heat, which is used for heating a channel region of the thin film transistor, within a duration which is associated with the stored light energy. In an example, the material may be synthesized through following process steps: 4-hydroxy Azobenzene is selected as a raw material, and 2-methacrylic chloride and tetrahydrofuran are added in the raw material, then they react with one another for 48 hours at room temperature and for 3 hours at a temperature environment of 60°, thereby producing a material for the layer of polymer film 03.

Figure 6B:
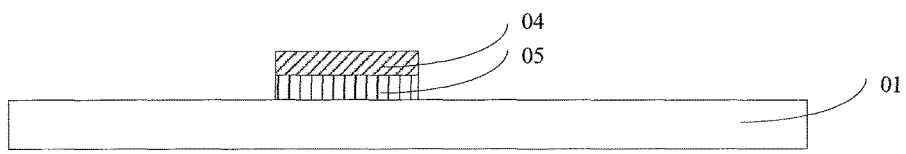

In step 2, referring to FIG. 6(b), a polymer layer 04 and a pulse electrode 05 are formed by using a same mask;

In some embodiments, the pulse electrode 05 may be electrically connected with a pulse signal line for transmitting a pulse signal to the pulse electrode 05, and the pulse electrode 05 may generate a thermal pulse trigger signal to be provided to the polymer layer 04 based on a received pulse signal. A resistance per unit length of the pulse electrode 05 may be set to larger than a resistance per unit length of the pulse signal line as much as possible by designing line widths of the pulse electrode and the pulse signal line. The pulse electrode 05 may also be formed in an annular shape or curved shape, so the length of the pulse electrode 05 is increased, thereby increasing the resistance of the pulse electrode 05.

Figure 6C:
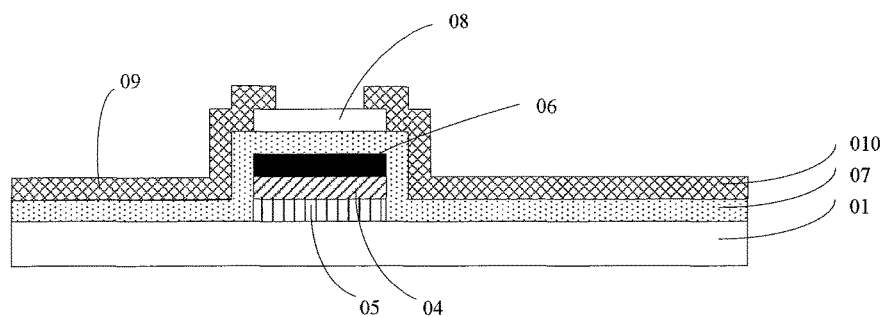

In step 3, referring to FIG. 6(c), a gate 06, a gate insulation layer 07, an active layer 08, a source electrode 09 and a drain electrode 010 are formed above the polymer layer 04.

Processes of forming the gate 06, the gate insulation layer 07, the active layer 08, the source electrode 09 and the drain electrode 010 may be the same as those in prior arts and will be not repeatedly described herein.

Based on the same inventive concept, an embodiment of the present disclosure further provides a display device, comprising the thin film transistor described above in embodiments of the present disclosure. In an embodiment of the present disclosure, the display device may be a display panel (for example, a liquid crystal display panel), the liquid crystal display panel may further comprise a pixel electrode, which may be electrically connected with the drain electrode directly, or may be electrically connected with the drain electrode through a via hole.

To sum up, in technique solutions of the embodiments of the present disclosure, the thin film transistor comprises a gate, a gate insulation layer, an active layer, a source electrode and a drain electrode, and further comprises a heat source disposed above or below the active layer and configured to, when triggered by a trigger signal, release heat for heating a channel region of the active layer, thereby the carrier mobility in the channel region of the thin film transistor may be improved.

It would be apparent that the person skilled in the art may make various changes or modifications to the present disclosure without departing from spirit and scopes of the disclosure. Thus, if these changes or modifications to the present disclosure fall within scopes of claims and equivalents thereof of the present disclosure, the present disclosure is intended to include these changes or modifications therein.

What is claimed is:

1. A thin film transistor, comprising a gate, a gate insulation layer, an active layer, a source electrode and a drain electrode, wherein the thin film transistor further comprises a heat source disposed above or below the active layer and configured to heat a channel region of the active layer,
   wherein the heat source comprises a heating layer and an electrode for providing a heating trigger signal to the heating layer; and
   wherein the electrode is configured to be electrically connected with a signal line so as to generate the heating trigger signal based on a signal from the signal line, and the heating layer is configured to, when triggered by the heating trigger signal, release heat for heating, the channel region.

2. The thin film transistor according to claim 1, wherein the heating layer includes a polymer layer, the electrode includes a pulse electrode for providing a thermal pulse trigger signal to the polymer layer, the pulse electrode is configured to be electrically connected with a pulse signal line for transmitting a pulse signal to the pulse electrode, and the polymer layer is configured to release heat when triggered by the thermal pulse trigger signal.

3. The thin film transistor according to claim 2, wherein the material of the polymer layer includes a material capable of absorbing and storing light energy and configured to, when triggered by a thermal pulse, produce a chemical reaction and release heat.

4. The thin film transistor according to claim 2, wherein the polymer layer is closer to the active layer than the pulse electrode.

5. The thin film transistor according to claim 2, wherein the pulse electrode is disposed in the same layer as the pulse signal line.

6. The thin film transistor according to claim 5, wherein a line width of the electrode is smaller than a line width of the signal line.

7. The thin film transistor according to claim 2, wherein a line width of the pulse electrode is smaller than a line width of the pulse signal line.

8. The thin film transistor according to claim 7, wherein the electrode has a annular shape or curved shape.

9. The thin film transistor according to claim 1, wherein an area of an orthographic projection of the heat source on a plane where a substrate, on which the gate, the gate insulation layer, the active layer, the source electrode and the drain electrode are formed, is located is equal to or larger than an area of an orthographic projection of the channel region of the active layer on the plane.

10. The thin film transistor according to claim 1, wherein an area of an orthographic projection of the heat source on a plane where a substrate, on which the gate, the gate insulation layer, the active layer, the source electrode and the drain electrode are formed, is located is equal to or larger than an area of an orthographic projection of the channel region of the active layer on the plane.

11. The thin film transistor according to claim 6, wherein an area of an orthographic projection of the heat source on a plane where a substrate, on which the gate, the gate insulation layer, the active layer, the source electrode and the drain electrode are formed, is located is equal to or larger than an area of an orthographic projection of the channel region of the active layer on the plane.

12. The thin film transistor according to claim 1, wherein the heat source is located on a side of the gate facing away from the active layer.

13. The thin film transistor according to claim 12, wherein the thin film transistor is a bottom gate type thin film transistor and the heat source is located below the gate; or the thin film transistor is a top gate type thin film transistor and the heat source is located above the gate.

14. The thin film transistor according to claim 1, wherein the heat source is located on a side of the active layer facing away from the gate, and the thin film transistor further comprises an insulation layer between the heat source and the active layer.

15. A display device, comprising the thin film transistor according to claim 1.

16. A method of manufacturing a thin film transistor, the method comprising forming a gate, a gate insulation layer, an active layer, a source electrode and a drain electrode on a substrate, wherein the method further comprises:
   forming a heat source above or below the active layer, the heat source being configured to heat a channel region of the active layer,
   wherein the forming the heat source comprises:
   forming a polymer layer and a pulse electrode for providing a thermal pulse trigger signal to the polymer layer, the pulse electrode being configured to be electrically connected with a pulse signal line for transmitting a pulse signal to the pulse electrode, and the polymer layer being channel region.

17. The method according to claim 16, comprising forming the polymer layer and the pulse electrode by using a same mask.

18. The method according to claim 17, wherein the forming the polymer layer and the pulse electrode by using the same mask comprises:
   forming a layer of polymer film and a layer of metal film respectively; and patterning the layer of polymer film and the layer of metal film by using the same mask so as to form the polymer layer and the pulse electrode;
or,
the forming the polymer layer and the pulse electrode by using the same mask comprises:
forming a layer of polymer film;
patterning the layer of polymer film by using a mask so as to form the polymer layer;
forming a layer of metal film; and
patterning the layer of metal film by using the same mask so as to form the pulse electrode.

* * * * *